US 6,229,397 B1

United States Patent
Miura

(10) Patent No.: US 6,229,397 B1
(45) Date of Patent: May 8, 2001

(54) AUTOMATIC GAIN CONTROL CIRCUIT RECEIVING APPARATUS INCORPORATING SAID CIRCUIT AUTOMATIC GAIN CONTROL METHOD ADAPTABLE TO RECEIVING APPARATUS AND RECORDING MEDIUM

(75) Inventor: Nozomi Miura, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/394,490

(22) Filed: Sep. 13, 1999

(30) Foreign Application Priority Data

Sep. 16, 1998 (JP) .................................. 10-261680

(51) Int. Cl.[7] .................................................. H03G 3/20
(52) U.S. Cl. ........................................... 330/289; 330/134
(58) Field of Search ........................... 330/124 R, 129, 330/132, 133, 134, 289; 455/251.1

(56) References Cited

U.S. PATENT DOCUMENTS 5,451,907  *  9/1995  Keane et al. ................... 330/289 X

* cited by examiner

Primary Examiner—Steven J. Mottola
(74) Attorney, Agent, or Firm—Pearne & Gordon

(57) ABSTRACT

An automatic gain control circuit having a plurality of receiving systems is structured to unify the receiving systems for performing level detection into one system and feedback data for controlling the gains of variable gain amplifiers $11a$ and $11b$ is subjected to correction of dispersion of the temperature characteristics between the variable gain amplifiers $11a$ and $11b$ of the receiving systems by operating a thermistor 31 so that a portion of an automatic gain control loop is made to be common without use of automatic gain control loops by the number corresponding to the number of the receiving systems.

12 Claims, 10 Drawing Sheets

AUTOMATIC GAIN CONTROL CIRCUIT RECEIVING APPARATUS INCORPORATING SAID CIRCUIT AUTOMATIC GAIN CONTROL METHOD ADAPTABLE TO RECEIVING APPARATUS AND RECORDING MEDIUM

BACKGROUND OF THE INVENTION

The present invention relates to an automatic gain control circuit, a receiving apparatus incorporating the circuit, an automatic gain control method for the receiving apparatus and a recording medium on which a program for causing the automatic gain control method to be executed. More particularly, the present invention relates to an automatic gain control circuit arranged to commonly use an automatic gain control loop to reduce the size of the circuit so as to prevent enlargement of the mounting area of a circuit substrate and power consumption in the circuit and a receiving apparatus incorporating the circuit. More particularly, the present invention relates to an automatic gain control method for a receiving apparatus with which elongation of time required to complete a process and enlargement of power consumption can be prevented when a software program is used to automatically control gains of a plurality of receiving systems and a recording medium.

As a conventional automatic gain control circuit for a receiving apparatus, an automatic gain control circuit having a structure, for example, as shown in FIG. 10, is known. Referring to FIG. 10, the conventional automatic gain control circuit comprises a variable gain amplifier 11, a demodulating portion 12, an A/D converter 13, a level detector 14, an averaging portion 21, an adder 22 for calculating difference in a converged value, a multiplier 23 for controlling a loop gain, an adder 24 of an integration circuit, a latch circuit 25 of the integration circuit, a calculating portion 26 and a D/A converter 27.

In the foregoing conventional automatic gain control circuit, when received signal Ri has been input, the received signal Ri is amplified by the variable gain amplifier 11, and then demodulated by the demodulating portion 12. Then, the received signal Ri is converted into a digital value by the A/D converter 13 so as to be demodulated output Rd. The level of a portion of the demodulated output Rd is detected by the level detector 14, and then fetched by an automatic gain control loop.

Data subjected to the level detection is averaged for a predetermined time by the averaging portion 21. Then, convergence to the input of the A/D converter 13 is realized by calculating the difference from a predetermined target level A by the adder 22 for calculating difference in a converged value. Then, the multiplier 23 for controlling a loop gain multiplies loop gain control value B in the automatic gain control circuit. The output of the multiplier 23 is, as change from preceding data, input to the integration circuit composed of the adder 24 and the latch circuit 25. Thus, integrated data is latched in the latch circuit 25 at the timing of the latch timing control value D. Integrated data of the integration circuit is converted into data corresponding to a control voltage for the variable gain amplifier 11 by the calculating portion 26. The D/A converter 27 converts data into an analog voltage so as to be fed back as the control voltage for the variable gain amplifier 11.

Hitherto, when the gains of a plurality of receiving systems are automatically controlled by using the automatic gain control circuit structured as shown in FIG. 10, the automatic gain control loops must be formed by the number which is the same as the number of the receiving systems. That is, when one automatic gain control loop shown in FIG. 10 is used to control a plurality of receiving system, for example, two receiving systems, the automatic gain control circuit shown in FIG. 10 is provided for each of the receiving systems, as shown in FIG. 11.

As described above, the conventional automatic gain control circuit and the receiving apparatus incorporating the circuit above are used to automatically control the gains of n (n is a positive integer not smaller than two) receiving systems. When the automatic gain control loop is structured by hardware, that is, constituted by electronic elements, the size of the automatic gain control loop block is enlarged to n times the size required when one receiving system is controlled. Thus, there arises a problem in that the mounting area of the circuit substrate is enlarged or the power consumption in the circuit is enlarged.

When a DSP (Digital Signal Processor) is employed in the automatic gain control loop to use a software program to automatically control the gains of n receiving systems, there also arises a problem in that time required to complete the automatic gain control process is elongated and, therefore, power consumption is enlarged.

SUMMARY OF THE INVENTION

To overcome the foregoing problems, an object of the present invention is to provide an automatic gain control circuit incorporating a plurality of variable gain amplifiers for controlling the amplitudes of a plurality of received signals in response to control signals and arranged to commonly use an automatic gain control loop to reduce the size of the circuit so as to prevent enlargement of the mounting area of a circuit substrate and power consumption in the circuit and a receiving apparatus incorporating the circuit.

Another object of the present invention is to provide an automatic gain control circuit which is capable of preventing elongation of time required to complete a process and enlargement of power consumption if the DSP (Digital Signal Processor) is employed in an automatic gain control loop and a software program is used to automatically control gains of a plurality of receiving systems and a recording medium.

To solve the foregoing problems, an automatic gain control circuit of the present invention and incorporating n variable gain amplifiers for controlling the amplitudes of n (n is a positive integer not smaller than two) received signals in response to control signals, the automatic gain control circuit comprising: control-signal generating means for detecting the level of one of n received signals to generate a feedback signal so as to employ the feedback signal as a control signal for one of the n variable gain amplifiers; and first correction means for subjecting the control signal for the one variable gain amplifier generated by the control-signal generating means to correction of dispersion of temperature characteristics of the other variable gain amplifiers so as to employ the corrected signals as control signals for the other variable gain amplifiers.

Preferably, in the automatic gain control circuit, the first correction means is a thermistor for performing temperature compensation.

An automatic gain control circuit according to another aspect of the invention, comprises n variable gain amplifiers each of which controls the amplitudes of n (n is a positive integer not smaller than two) received signals in response to a control signal, the automatic gain control circuit comprising: control-signal generating means for detecting the level of one of n received signals to generate a feedback signal so as to employ the feedback signal as a control signal for one of n variable gain amplifiers; and second correction means for subjecting the control signal for the one variable gain amplifier generated by the control-signal generating means to correction of dispersion of temperature characteristics and frequency characteristics of the other variable gain amplifiers so as to employ the corrected signals as control signals for the other variable gain amplifiers.

Preferably, in the automatic gain control circuit, the second correction means is adding means for adding a predetermined correction value to the control signal of the one variable gain amplifier.

Additionally, in the automatic gain control circuit, the control-signal generating means comprises n level detection means for detecting the levels of n received signals; comparison means for comparing the detected levels of the n received signals; and selection means for selecting an output of a level detection means having a highest detected level in accordance with a result of a comparison made by the comparison means.

Further, according to another aspect of the present invention, a receiving apparatus comprises the automatic gain control circuit as mentioned above.

According to the present invention, an automatic gain control method for a receiving apparatus comprises n variable gain amplifiers for controlling the amplitudes of n (n is a positive integer not smaller than two) received signals in response to control signals, the automatic gain control method for a receiving apparatus comprising: a control-signal generating step for detecting the level of one of n received signals to generate a feedback signal so as to employ the feedback signal as a control signal for one of the n variable gain amplifiers; and a first correction step for subjecting the control signal for the one variable gain amplifier generated in the control-signal generating step to correction of dispersion of temperature characteristics of the other variable gain amplifiers so as to employ the corrected signals as control signals for the other variable gain amplifiers.

Moreover, an automatic gain control method for a receiving apparatus comprises n variable gain amplifiers each of which controls the amplitudes of n (n is a positive integer not smaller than two) received signals in response to control signals, the automatic gain control method for a receiving apparatus comprising: a control-signal generating means for detecting the level of one of n received signals to generate a feedback signal so as to employ the feedback signal as a control signal for one of the n variable gain amplifiers; and a second correction step for subjecting the control signal for the one variable gain amplifier generated in the control-signal generating step to correction of dispersion of temperature characteristics and frequency characteristics of the other variable gain amplifiers so as to employ the corrected signals as control signals for the other variable gain amplifiers.

In the automatic gain control method for a receiving apparatus, the control-signal generating step comprises n level detection steps for detecting the levels of n received signals; a comparison step for comparing the detected levels of the n received signals; and a selection step for selecting an output of a level detection step having a highest detected level in accordance with a result of a comparison made in the comparison means.

Furthermore, a recording medium which can be read by a computer stores a program which causes a computer to execute the automatic gain control method for the receiving apparatus as mentioned above.

According to the present invention, the control-signal generating means detects the level of one of n received signals to generate a feedback signal so as to employ the feedback signal as a control signal for one of the n variable gain amplifiers. As for the other variable gain amplifiers of n variable gain amplifiers, the first correction means (the first correction step) subjects the control signal for the one variable gain amplifier generated by the control-signal generating means (the control signal generating step) to correction of dispersion of temperature characteristics of the other variable gain amplifiers so as to employ the corrected signals as control signals for the other variable gain amplifiers. In particular, the automatic gain control circuit has the structure that the first correction means is realized by a thermistor for performing temperature compensation.

As a result, an automatic gain control circuit incorporating n variable gain amplifiers for controlling the amplitudes of n (n is a positive integer not smaller than two) received signals in response to control signals and the receiving apparatus comprise the foregoing circuit are enabled to have a common portion of the circuit without a necessity of incorporating automatic gain control loop circuits by the number corresponding to the number of the receiving systems. Thus, the size of the circuit can be reduced and enlargement of the mounting area of the circuit substrate and that of power consumption in the circuit can be prevented. Also the automatic gain control method incorporating the automatic gain control loop incorporating the DSP (Digital Signal Processor) and the like to execute a software program to automatically control the gains of n receiving systems and the recording medium are enabled to make data to be common. Thus, elongation of time required to complete the process and enlargement of power consumption can be prevented.

Moreover, according to the present invention, the control-signal generating means detects the level of one of n received signals to generate a feedback signal so as to employ the feedback signal as a control signal for one of n variable gain amplifiers. As for the other variable gain amplifier of the n variable gain amplifiers, the second correction means (the second correction step) subjects the control signal for the one variable gain amplifier generated by the control-signal generating means (the control-signal generating step) to correction of dispersion of temperature characteristics and frequency characteristics of the other variable gain amplifiers so as to employ the corrected signals as control signals for the other variable gain amplifiers. In particular, the automatic gain control circuit has the structure that the first correction means is realized by the adding means for adding a predetermined correction value to the control signal of the one variable gain amplifier.

As a result, an automatic gain control circuit incorporating n variable gain amplifiers for controlling the amplitudes of n (n is a positive integer not smaller than two) received signals in response to control signals and the receiving apparatus comprise the foregoing circuit are enabled to have a common portion of the circuit without a necessity of incorporating automatic gain control loop circuits by the number corresponding to the number of the receiving systems. Thus, the size of the circuit can be reduced and enlargement of the mounting area of the circuit substrate and that of power consumption in the circuit can be prevented. Also the automatic gain control method incorporating the automatic gain control loop incorporating the DSP (Digital Signal Processor) and the like to execute a software program to automatically control the gains of n receiving systems and the recording medium are enabled to make data to be common. Thus, elongation of time required to complete the process and enlargement of power consumption can be prevented.

It is preferable that the control-signal generating means comprises n level detection means (level detection steps) for detecting the levels of n received signals, the comparison means (comparison step) compares the detected levels of the n received signals, and the selection means (the selection step) selects an output of a level detection means having a highest detected level in accordance with a result of a comparison made by the comparison means.

As a result, if a plurality of received signals having different levels are input owing to an influence of fading or multipath, a signal having the highest level is always selected so as to generate a gain control signal for the variable gain amplifier. Therefore, a problem that an excessively large input is supplied to the A/D converter which is usually disposed in the rear of the variable gain amplifier of a signal system which is not selected and thus the A/D converter is saturated can be prevented.

DETAILED DESCRIPTION OF THE PREFERRED EMBODIMENTS

First to fifth embodiments of an automatic gain control circuit, a receiving apparatus comprise the circuit, an automatic gain control method for the receiving apparatus and a recording medium according to the present invention will now be described with reference to the drawings. In each of the embodiments, the automatic gain control circuit, the receiving apparatus incorporating the circuit and the automatic gain control method for the receiving apparatus will be described. Since the recording medium according to the present invention is a recording medium in which the program for causing the automatic gain control method to be executed has been recorded, the description of the recording medium is included in the following description of the automatic gain control method.

First Embodiment

Figure 1:
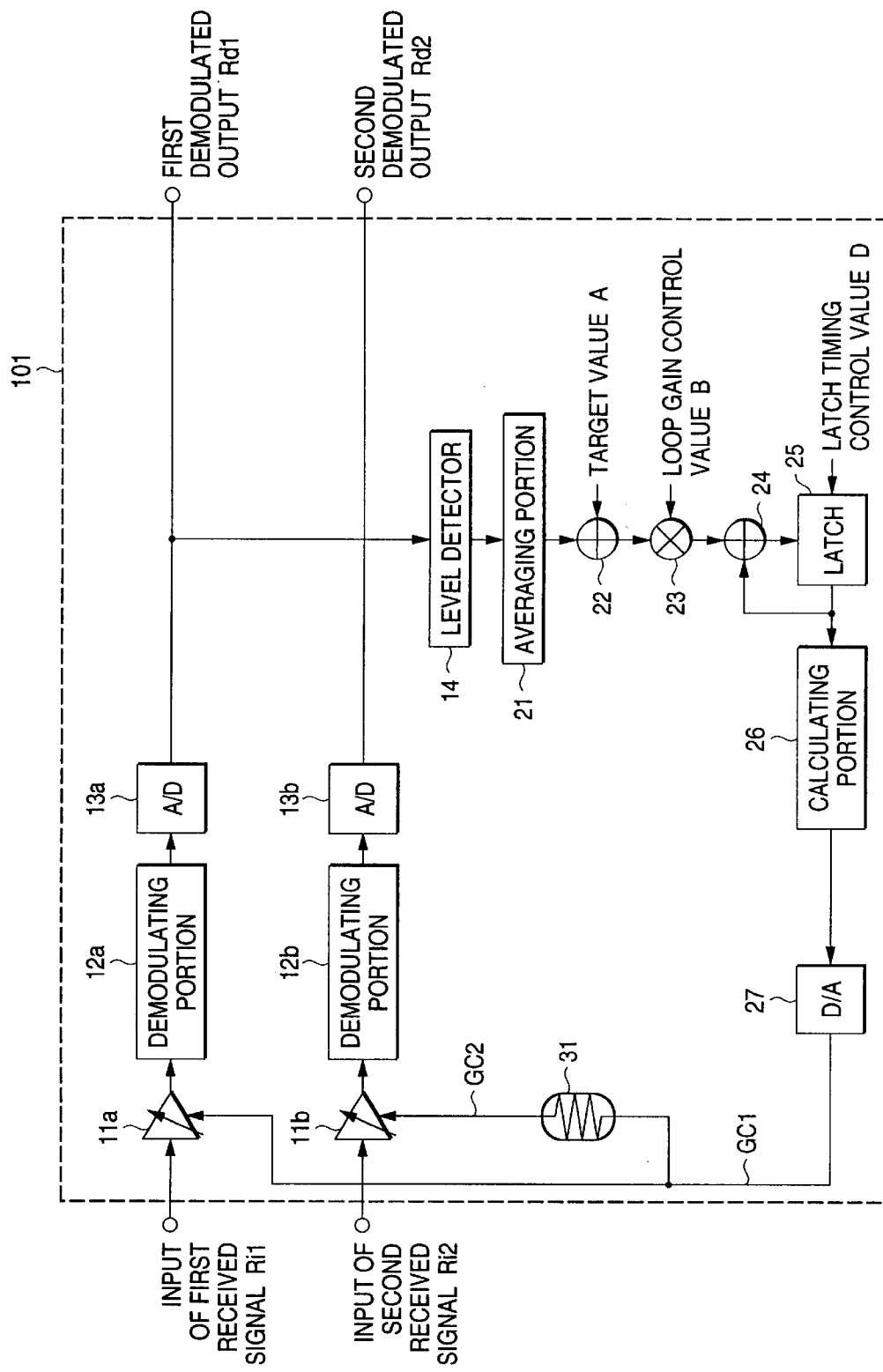
FIG. 1 is a diagram showing the structure of an automatic gain control circuit according to a first embodiment of the present invention.
Figure 10:
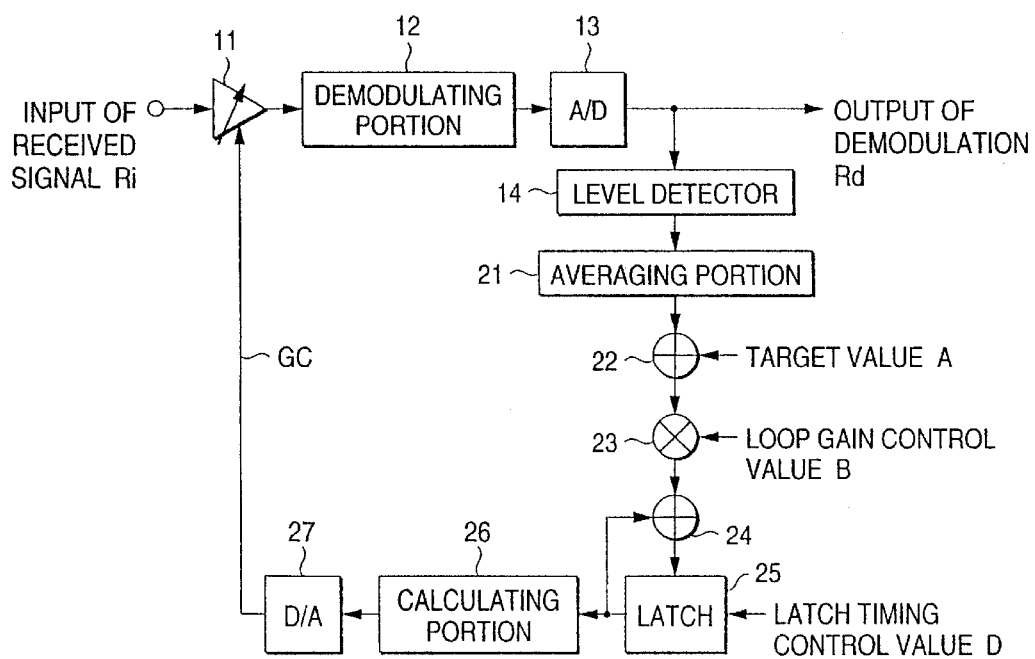
FIG. 10 is a diagram showing the structure of an automatic gain control circuit of a conventional receiving apparatus.
Figure 11:
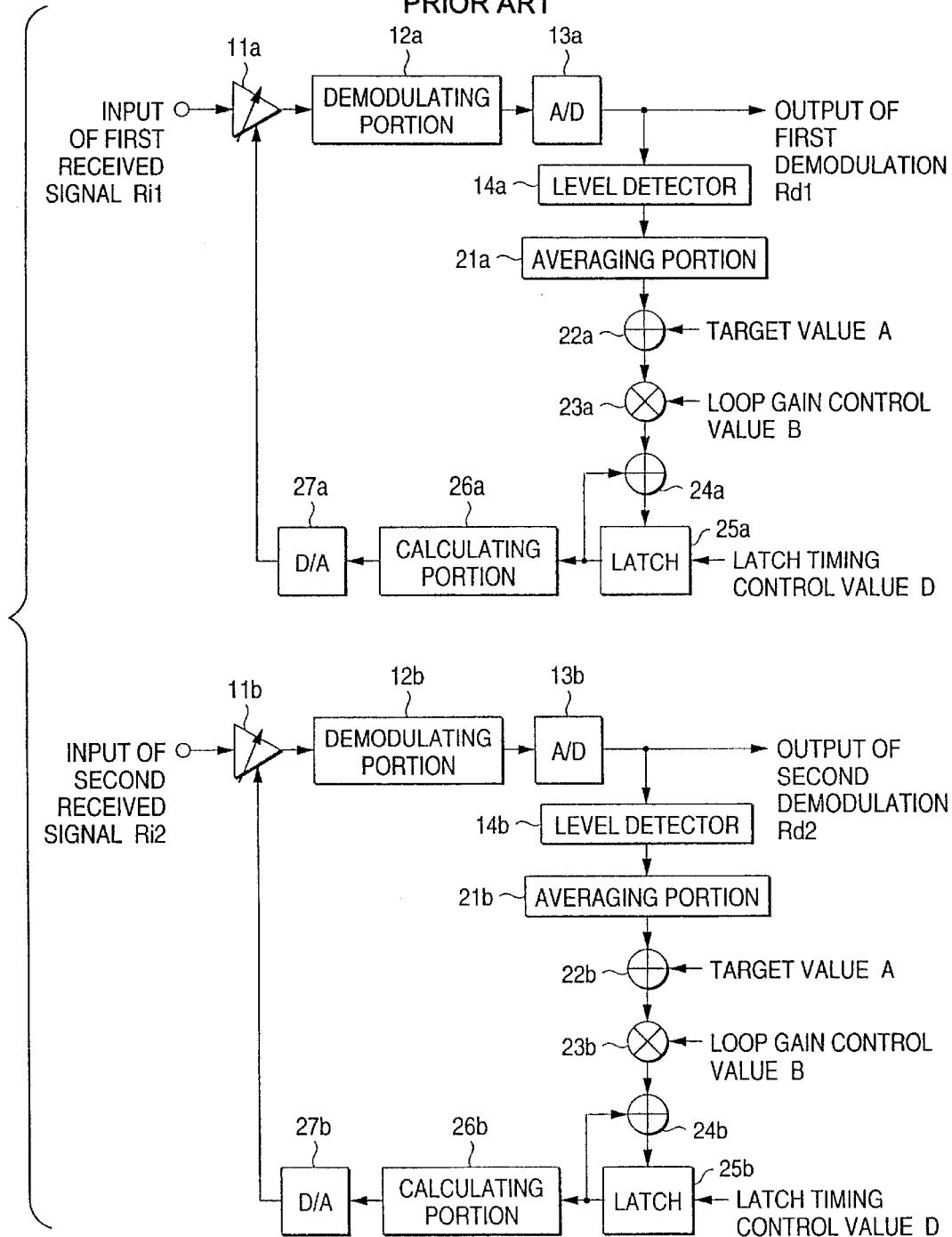
FIG. 11 is a diagram showing the structure of a conventional automatic gain control circuit which controls two receiving systems.

FIG. 1 is a diagram showing the structure of the automatic gain control circuit according to a first embodiment. The automatic gain control method according to the present invention is applied to the foregoing automatic gain control circuit. Referring to FIG. 1, the same portions as those shown in FIG. 10 (the conventional structure) are given the same reference numerals. In this embodiment, as the automatic gain control circuit incorporating a plurality of receiving systems, a receiving apparatus having two receiving systems will now be described.

Referring to FIG. 1, the automatic gain control circuit according to this embodiment comprises variable gain amplifiers 11a and 11b, demodulating portions 12a and 12b, A/D converters 13a and 13b, a level detector 14, an averaging portion 21, an adder 22 for calculating difference in a converged value, a multiplier 23 for controlling a loop gain, an adder 24 of an integration circuit, a latch circuit 25 of the integration circuit, a calculating portion 26, a D/A converter 27 and a thermistor 31.

The first variable gain amplifier 11a, the first demodulating portion 12a and the first A/D converter 13a constitute a first receiving system for receiving first received signal Ri1 and outputting first demodulated signal Rd1. The second variable gain amplifier 11b, the second demodulating portion 12b and the second A/D converter 13b constitute a second receiving system for receiving second received signal Ri2 and outputting second demodulated signal Rd2. The level detector 14, the averaging portion 21, the adder 22 for calculating difference in a converged value, the multiplier 23 for controlling a loop gain, the adder 24 of the integration circuit, the latch circuit 25 of the integration circuit, the calculating portion 26, the D/A converter 27 and the thermistor 31 constitute an automatic gain control loop.

In the first and second receiving systems, the variable gain amplifiers 11a and 11b are able to vary the gains according to the potentials of the control signals GC1 and GC2 generated by the automatic gain control loop. The demodulating portions 12a and 12b demodulate first and second received signals (Ri1 and Ri2). The A/D converters 13a and 13b convert the demodulated signals into digital signals to output first and second demodulated signals Rd1 and Rd2.

In the automatic gain control loop, initially, the level detector 14 detects the level of the first demodulated signal Rd1. Then, the averaging portion 21 averages the detected level of the signal for only a predetermined time. The adder 22 for calculating difference in a converged value calculates the difference between output data from the averaging portion 21 and target convergence level A input to the first A/D converter 13a. The multiplier 23 for controlling a loop gain controls the loop gain of the automatic gain control loop by multiplying loop-gain control value B. The adder 24 of the integration circuit and the latch circuit 25 of the integration circuit latch a result of the addition at timing of latch-timing control value D to integrate data.

The calculating portion 26 generates, from integrated data, control voltage data for the first variable gain amplifier 11a. Generated control voltage data is converted into an analog value by the D/A converter 27 so as to be supplied to the first variable gain amplifier 11a of the first receiving system as control signal GC1 having a potential determined by the automatic gain control loop. The thermistor 31 corrects dispersion of the temperature characteristic of the second variable gain amplifier 11b of the second receiving system. Thus, the gain of the second variable gain amplifier 11b is controlled with the potential of the corrected control signal GC2.

The operation of the automatic gain control circuit according to this embodiment will now be described with reference to FIG. 1. When the first received signal Ri1 and second received signal Ri2 have been input, the signals are amplified by the variable gain amplifiers 11a and 11b. Then, the signals are demodulated by the demodulating portions 12a and 12b, and then converted into digital values by the A/D converters 13a and 13b so as to be output as the first demodulated signal Rd1 and the second demodulated signal Rd2. In only the first receiving system to which the first received signal Ri1 is input, the level of a portion of the first demodulated signal Rd1, which is the output, is detected by the level detector 14 to fetch the signal into the automatic gain control loop.

Data, the level of which has been detected by the level detector 14, is subjected to the averaging process for only a predetermined time by the averaging portion 21. Data is interval-averaged for 0.625 [ms], and then latched. Then, data is moving-averaged for time which is an integer multiple of 0.625 [ms]. To converge to the input to the first A/D converter 13a, the adder 22 for calculating difference in a converged value calculates the difference from a predetermined target value A (for example, 0.5 [Vp-p]). Then, the multiplier 23 for controlling a loop gain multiplies the loop-gain control value B. Thus, the loop gain of the automatic gain control loop is controlled. The output of the multiplier 23 for controlling a loop gain is, as change from preceding loop-gain data output from the automatic gain control loop, supplied to the integration circuit constituted by the adder 24 of the integration circuit and the latch circuit 25 of the integration circuit.

Data integrated by the integration circuit is, by the calculating portion 26, converted into data corresponding to the control voltage for the first variable gain amplifier 11a. A result of the calculation is converted into an analog value by the D/A converter 27 so as to be fed back as the control voltages for the variable gain amplifiers 11a and 11b according to data above. When feedback to each of the variable gain amplifiers 11a and 11b is performed, the output GC1 of the D/A converter 27 is, as it is, used for the first variable gain amplifier 11a of the first receiving system which is performing level detection. The output GC2 through the thermistor 31 is used for the second variable gain amplifier 11b of the second receiving system which is not performing the level detection in order to correct dispersion of the temperature characteristics of the first variable gain amplifier 11a and the second variable gain amplifier 11b.

The parameters for use in the interval averaging and moving average which are performed by the averaging portion 21 may be parameters calculated by the DSP or parameters obtained by making a reference to a reference table, such as a numeric-value conversion table written on a ROM or the like. Other parameters, such as the target value A which is added by the adder 22 for calculating difference in a converged value, the loop-gain control value B which is multiplied by the multiplier 23 for controlling a loop gain and the latch-timing control value D may be those calculated by the DSP or the like. As an alternative to this, parameters obtained by making a reference to a reference table, such as a numeric-value conversion table, written on a ROM or the like may be employed.

When the digital signal processor (DSP) is employed in the automatic gain control loop of the automatic gain control circuit according to this embodiment, the structures of the level detector 14, the averaging portion 21, the adder 22 for calculating difference in a converged value, the multiplier 23 for controlling a loop gain, the adder 24 of the integration circuit, the latch circuit 25 of the integration circuit, the calculating portion 26 and the D/A converter 27 shown in FIG. 1 are realized by the DSP. The software program (automatic gain control method) which is executed by the DSP will now be described with reference to a flow chart shown in FIG. 2.

When first received signal Ri1 and second received signal Ri2 have been input, the input signals are, in steps S201a and 201b, amplified by the variable gain amplifiers 11a and 11b. The signals are demodulated by the demodulating portions 12a and 12b, and then converted into digital values by the A/D converters 13a and 13b so as to be output as the first demodulated signal Rd1 and second demodulated signal Rd2. The structure incorporating the DSP is arranged such that a portion of the first demodulated signal Rd1 is fetched by the first receiving system to which the first received signal Ri1 is input.

In step S202 level detection is performed. In step S203 data subjected to the level detection is subjected to the averaging process for only a predetermined time. For example, data is interval-averaged for 0.625 [ms], and then latched. Then, data is moving-averaged for time which is an integer multiple of 0.625 [ms]. In step S204 the difference from a predetermined target value A (for example, 0.5 [Vp-p]) is calculated to converge to the input to the first A/D converter 13a. In step S205 the loop-gain control value B is multiplied so as to control the loop gain of the automatic gain control loop. In step S206 a result of the multiplication performed in step S205 is, as change in the preceding loop gain data output from the automatic gain control loop, added (integrated) to the previous control data.

Data integrated in step S206 is, in step S207, converted into data (analog value) corresponding to the control voltage for the first variable gain amplifier 11a. Then, converted data is fed back as the control voltages for the variable gain amplifiers 11a and 11b. In steps S209a and 209b gain control is performed. When feedback to the variable gain amplifiers 11a and 11b is performed, the output GC1 is, as it is, used for the first variable gain amplifier 11a of the first receiving system (step S209a) which is performing the level detection. The output GC2 through the thermistor 31 is, in step S208, used for the second variable gain amplifier 11b of the second receiving system which is not performing the level detection. Thus, the dispersion of the temperature characteristics of the first variable gain amplifier 11a and the second variable gain amplifier 11b is corrected (step S209b). The parameters for the interval averaging, the moving averaging, the target value A in step S204 and the loop-gain control value B in step S205 are similar to those for the above-mentioned automatic gain control circuit.

As described above, the automatic gain control circuit according to this embodiment enables the automatic gain control circuit incorporating a plurality of receiving systems to make a portion of the automatic gain control loop to be common without the automatic gain control loops which have hitherto be required by the number corresponding to the number of the receiving systems. The foregoing structure can be realized by unifying the receiving systems for performing the level detection into one system and by subjecting feedback data for controlling the gain of the variable gain amplifiers to correction of the dispersion of the temperature characteristic of the variable gain amplifier of each receiving system by using the thermistor 31. Thus, the automatic gain control circuit incorporating the automatic gain control loop which is constituted by a circuit enables the number of the electronic circuit elements to be reduced. Thus, the size of the circuit can be reduced and enlargement of the mounting area of the circuit substrate and that of power consumption in the circuit can be prevented.

Also in a case where the digital signal processor (DSP) is employed in the automatic gain control loop to automatically control the gains of a plurality of receiving systems by executing a software program, commonality of data, which must be used, can be realized. Thus, elongation of time required to complete the process and enlargement of power consumption can be prevented.

Although this embodiment has the structure that the automatic gain control circuit has first and second receiving systems, a similar effect can be obtained from an automatic gain control circuit having three or more receiving systems.

Second Embodiment

Figure 3:
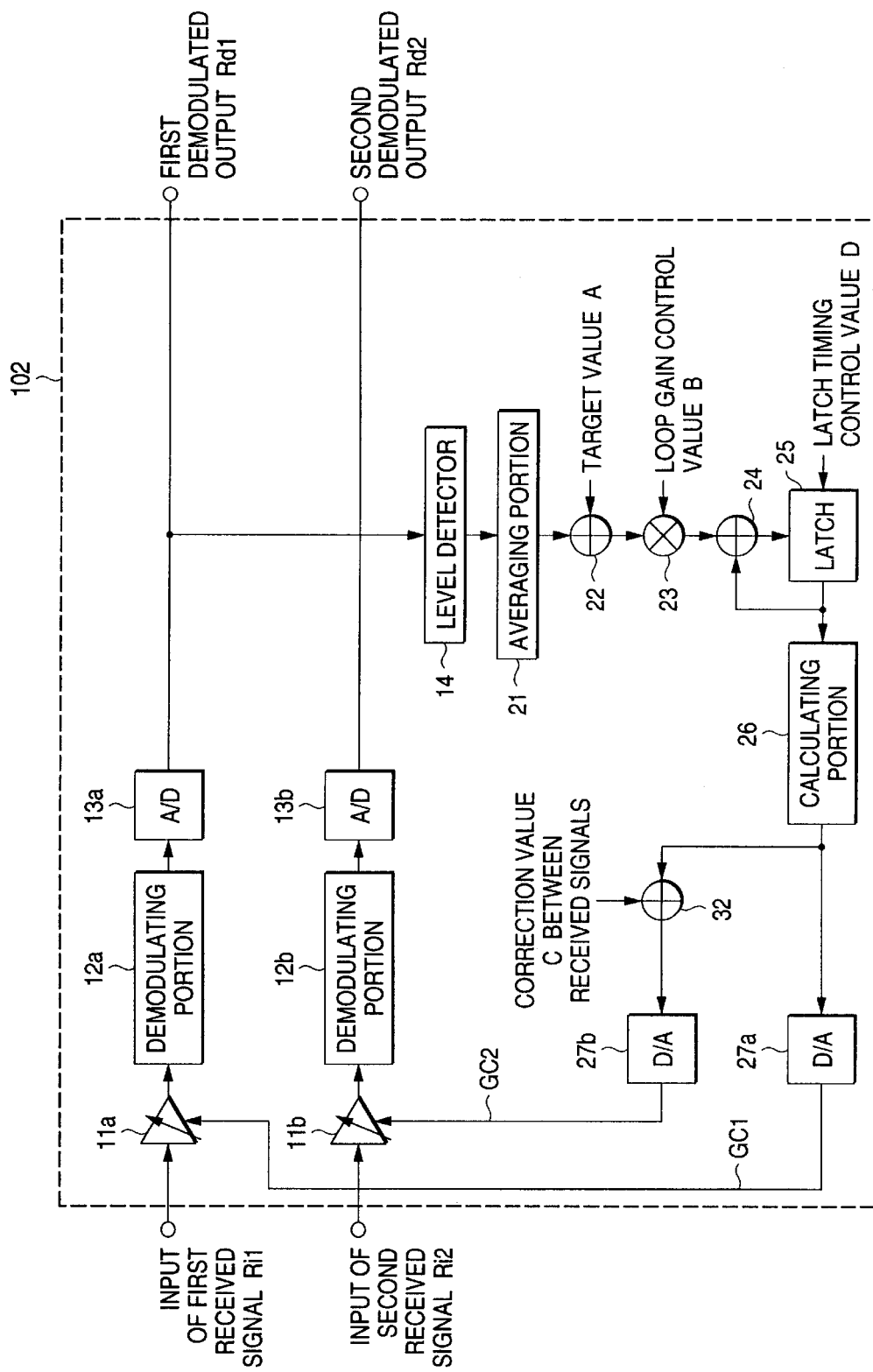
FIG. 3 is a diagram showing an automatic gain control circuit according to a second embodiment of the present invention.

FIG. 3 is a diagram showing the structure of an automatic gain control circuit according to a second embodiment of the present invention. The automatic gain control method according to the present invention is applied to the foregoing automatic gain control circuit. The same elements as those shown in FIG. 1 (the first embodiment) are given the same reference numerals and the same elements are omitted from illustration. Similarly to the first embodiment, the automatic gain control circuit according to this embodiment and incorporating a plurality of receiving systems has a receiving circuit including two receiving systems.

Referring to FIG. 3, the automatic gain control circuit according to this embodiment comprises the variable gain amplifiers 11a and 11b, the demodulating portions 12a and 12b, the A/D converters 13a and 13b, the level detector 14, the averaging portion 21, the adder 22 for calculating difference in a converged value, the multiplier 23 for controlling a loop gain, the adder 24 of the integration circuit, the latch circuit 25 of the integration circuit, the calculating portion 26, an adder 32 for correction and D/A converters 27a and 27b.

The first variable gain amplifier 11a, the first demodulating portion 12a and the first A/D converter 13a constitute the first receiving system to which the first received signal Ri1 is input and which outputs the first demodulated signal Rd1. The second variable gain amplifier 11b, the second demodulating portion 12b and the second A/D converter 13b constitute the second receiving system to which the second received signal Ri2 is input and which outputs the second demodulated signal Rd2. The level detector 14, the averaging portion 21, the adder 22 for calculating difference in a converged value, the multiplier 23 for controlling a loop gain, the adder 24 of the integration circuit, the latch circuit 25 of the integration circuit, the calculating portion 26, the adder 32 for correction and the D/A converters 27a and 27b constitute the automatic gain control loop.

The amplifying and demodulating operations of each of the receiving system are similar to those of the automatic gain control circuit according to the first embodiment. Similarly to the first embodiment, the automatic gain control loop sequentially performs the detection of the signal level of the first demodulated signal Rd1 which is performed by the level detector 14, averaging of the signal level for a predetermined time which is performed by the averaging portion 21, the calculation of the difference from the target value A which is performed by the adder 22 for calculating difference in a converged value, the control of the loop gain which is performed by the multiplier 23 for controlling a loop gain, and the integration of data which is performed by the adder 24 of the integration circuit and the latch circuit 25 of the integration circuit.

The calculating portion 26 generates, from the integration data, data about the control voltage for the first variable gain amplifier 11a, data above being converted into an analog value by the D/A converter 27a. Similarly to the first embodiment, the signal converted into the analog value is supplied to the first variable gain amplifier 11a of the first receiving system as the control signal GC1 having the potential determined by the automatic gain control loop. As for the control signal GC2 which is supplied to the second variable gain amplifier 11b of the second receiving system, correction value C between received signals Ri1 and Ri2 is added to control voltage data generated in the calculating portion 26 by the adder 32 for correction. Thus, dispersion of the temperature characteristic and that of the frequency characteristic between the variable gain amplifiers 11a and 11b are corrected. Moreover, a signal converted into an analog value by the D/A converter 27b is used. The potential of the control signal GC2 is used to control the gain of the second variable gain amplifier 11b.

The correction value C between the received signals may be the values calculated by the DSP or the like or the values obtained by making a reference to a reference table, such as a numeric-value conversion table written on a ROM or the like, similarly to the other parameters (A, B and D).

The operation of the automatic gain control circuit according to this embodiment will now be described with reference to FIG. 3. In each receiving system, similarly to the first embodiment, the first received signal Ri1 and second received signal Ri2 are amplified, demodulated and converted into digital values. Thus, the first demodulated signal Rd1 and second demodulated signal Rd2 are output. Similarly, the level of a portion of the first demodulated signal Rd1 of the first receiving system is detected by the level detector 14 so as to be fetched into the automatic gain control loop.

In the automatic gain control loop, similarly to the first embodiment, the level detection which is performed by the level detector 14, the averaging process which is performed by the averaging portion 21, the process for obtaining the difference from the target value A which is performed by the adder 22 for calculating difference in a converged value, the control of the loop gain by multiplying the loop-gain control value B which is performed by the multiplier 23 for controlling a loop gain, the integration process which is performed by the adder 24 and the latch circuit 25 and the data converting process which is performed by the calculating portion 26 are sequentially performed.

The signal converted into data corresponding to the control voltage for the first variable gain amplifier 11a by the calculating portion 26 is converted into an analog value by the D/A converter 27a. Thus, data is fed back as the control voltages for the variable gain amplifiers 11a and 11b according to data above. When feed back to the variable gain amplifiers 11a and 11b is performed, the output GC1 of the D/A converter 27a is, as it is, used for the first variable gain amplifier 11a of the first receiving system which is performing the level detection. As for the second variable gain amplifier 11b of the second receiving system which is not performing the level detection, dispersion of the temperature characteristic and that of the frequency characteristic of the first variable gain amplifier 11a and the second variable gain amplifier 11b are corrected by using the control signal GC2 to which the correction value C between the received signals has been added by the adder 32 for correction and which has been converted into the analog value by the D/A converter 27b.

Figure 4:
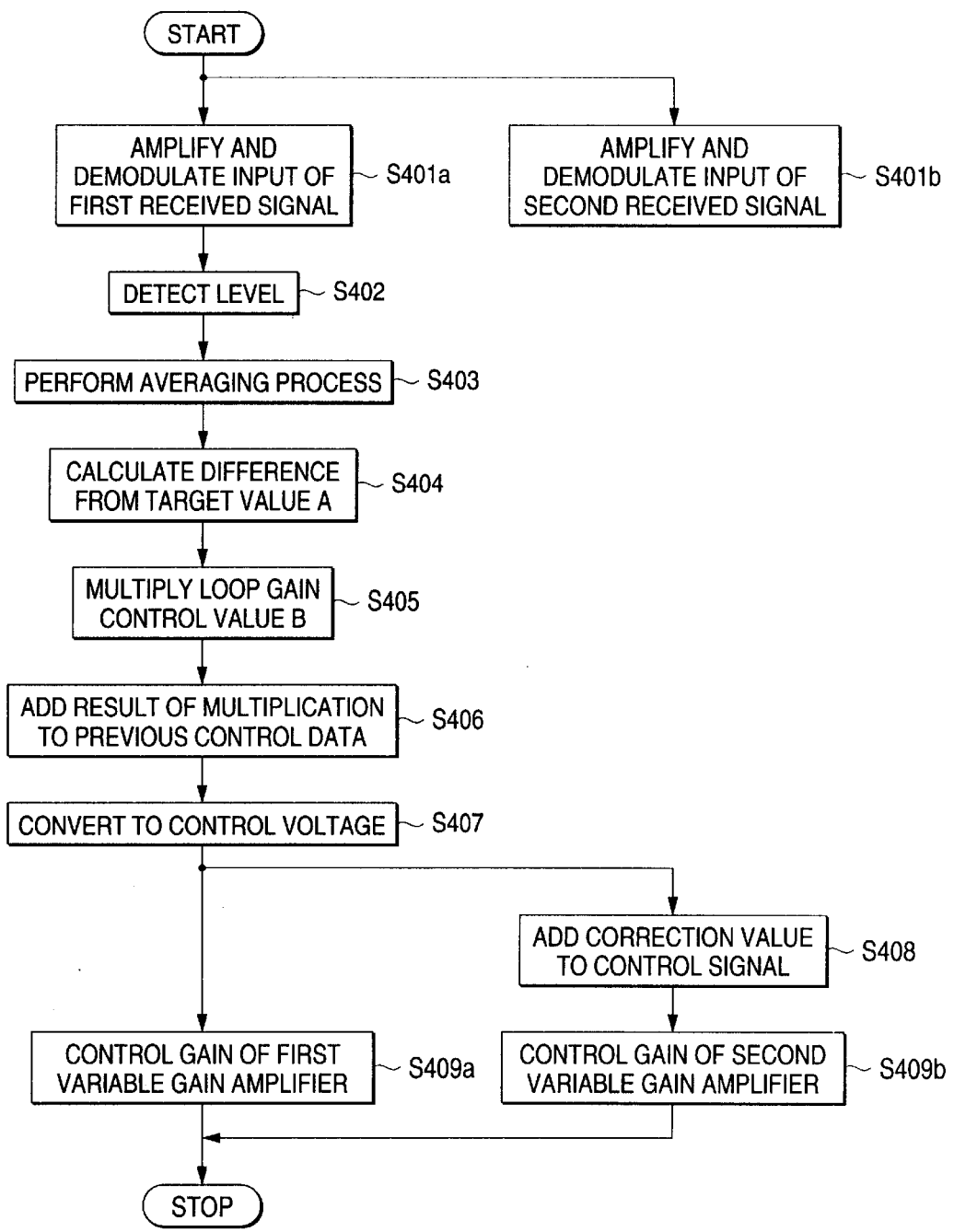
FIG. 4 is a flow chart of the procedure of a software program (a automatic gain control method) which is executed in a DSP according to the second embodiment.

When the digital signal processor (DSP) is employed in the automatic gain control loop of the automatic gain control circuit according to this embodiment, for example, the level detector 14, the averaging portion 21, the adder 22 for calculating difference in a converged value, the multiplier 23 for controlling a loop gain, the adder 24 of the integration circuit, the latch circuit 25 of the integration circuit, the calculating portion 26, the adder 32 for correction and the D/A converters 27a and 27b shown in FIG. 3 are realized by the DSP. The procedure of the software program (the automatic gain control method) which is executed by the DSP will now be described with reference to a flow chart shown in FIG. 4.

Figure 2:
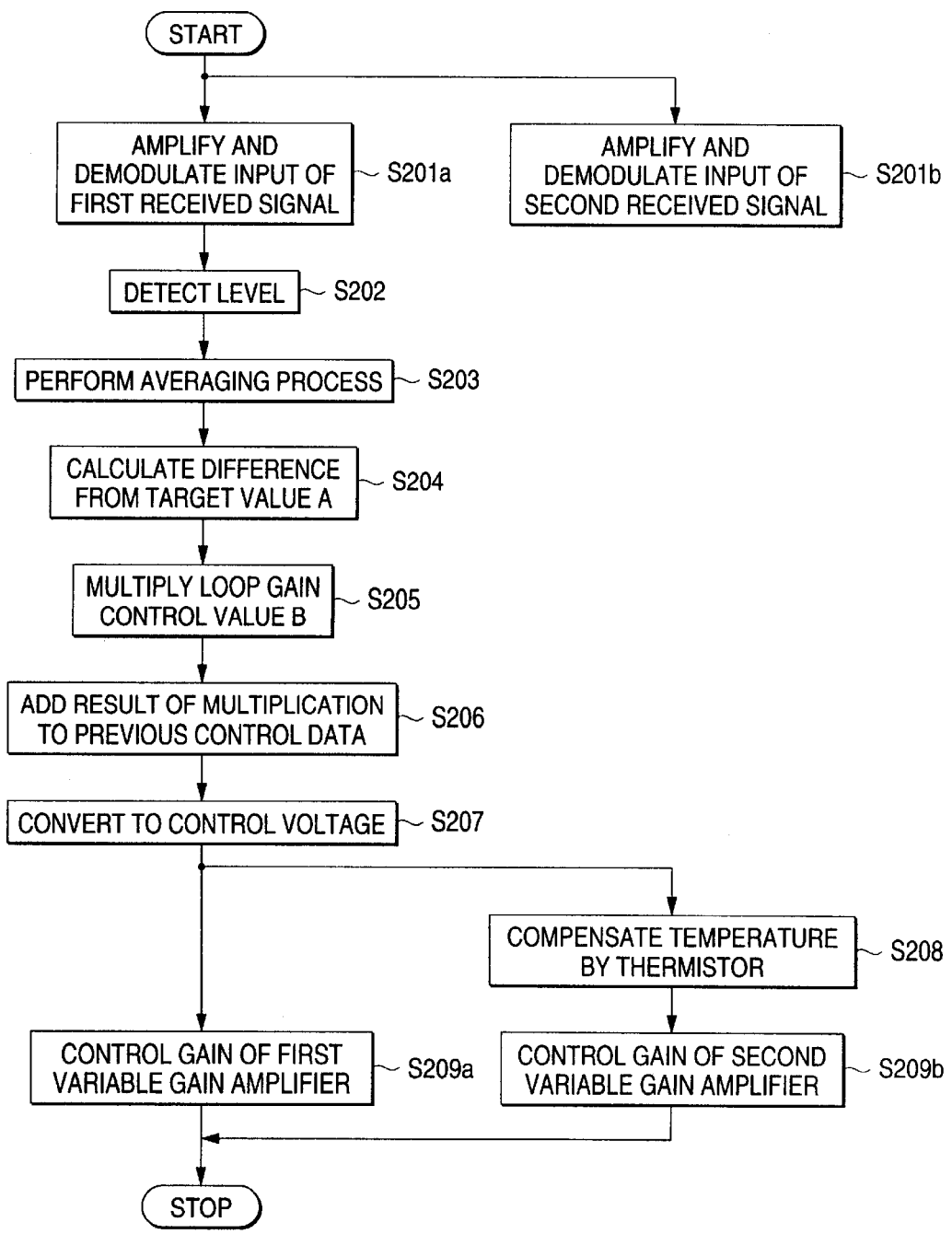
FIG. 2 is a flow chart of the procedure of a software program (a automatic gain control method) which is executed in a DSP according to the first embodiment.

Similarly to steps S201a and S201b shown in FIG. 2 (the first embodiment), the first and second received signals Ri1 and Ri2 are amplified by the variable gain amplifiers 11a and 11b, demodulated by the demodulating portions 12a and 12b and digital-converted by the A/D converters 13a and 13b in steps S401a and S401b. Thus, the first demodulated signal Rd1 and second demodulated signal Rd2 are output. In the DSP, a portion of the first demodulated signal Rd1 is fetched to the first receiving system to which the first received signal Ri1 is input.

The level detection in step S402, the averaging process in step S403, the calculation of the difference from the target value A in step S404, the control of the loop gain in step S405, the integration process in step S406 and the process for converting to data corresponding to the control voltage in step S407 are performed similarly to steps S202 to S207 shown in FIG. 2 (the first embodiment).

The output GC1 converted into data corresponding to the control voltage in step S407 is, as it is, used for the first receiving system which is performing the level detection so that the gain of the first variable gain amplifier 11a is controlled (step S409a). The output GC2 obtained by adding the correction value C between the received signals to the data converted in step S407 and corresponding the control voltage is, in step S408, used for the second receiving system which is not performing the level detection. Thus, the dispersion of the temperature characteristic and that of the frequency characteristic between the first variable gain amplifier 11a and the second variable gain amplifier 11b is corrected (step S409b). The correction value C between the received signals is similar to that for use in the above-mentioned automatic gain control circuit.

As described above, the automatic gain control circuit according to this embodiment enables the automatic gain control circuit incorporating a plurality of receiving systems to make a portion of the automatic gain control loop to be common without the automatic gain control loops which has hitherto be required by the number corresponding to the number of the receiving systems. The foregoing structure can be realized by unifying the receiving systems for performing the level detection into one system and by subjecting feedback data for controlling the gain of the variable gain amplifiers to correction of the dispersion of the temperature characteristic and that of the frequency characteristic of the variable gain amplifier of each receiving system by using the adder 32 for correction to add the correction value C. Thus, the automatic gain control circuit incorporating the automatic gain control loop which is constituted by a circuit enables the number of the electronic circuit elements to be reduced. Thus, the size of the circuit can be reduced and enlargement of the mounting area of the circuit substrate and that of power consumption in the circuit can be prevented.

Also in a case where the digital signal processor (DSP) is employed in the automatic gain control loop to automatically control the gains of a plurality of receiving systems by executing a software program, commonality of data, which must be used, can be realized. Thus, elongation of time required to complete the process and enlargement of power consumption can be prevented.

Although this embodiment has the structure that the automatic gain control circuit has first and second receiving systems, a similar effect can be obtained from an automatic gain control circuit having three or more receiving systems.

Third Embodiment

Figure 5:
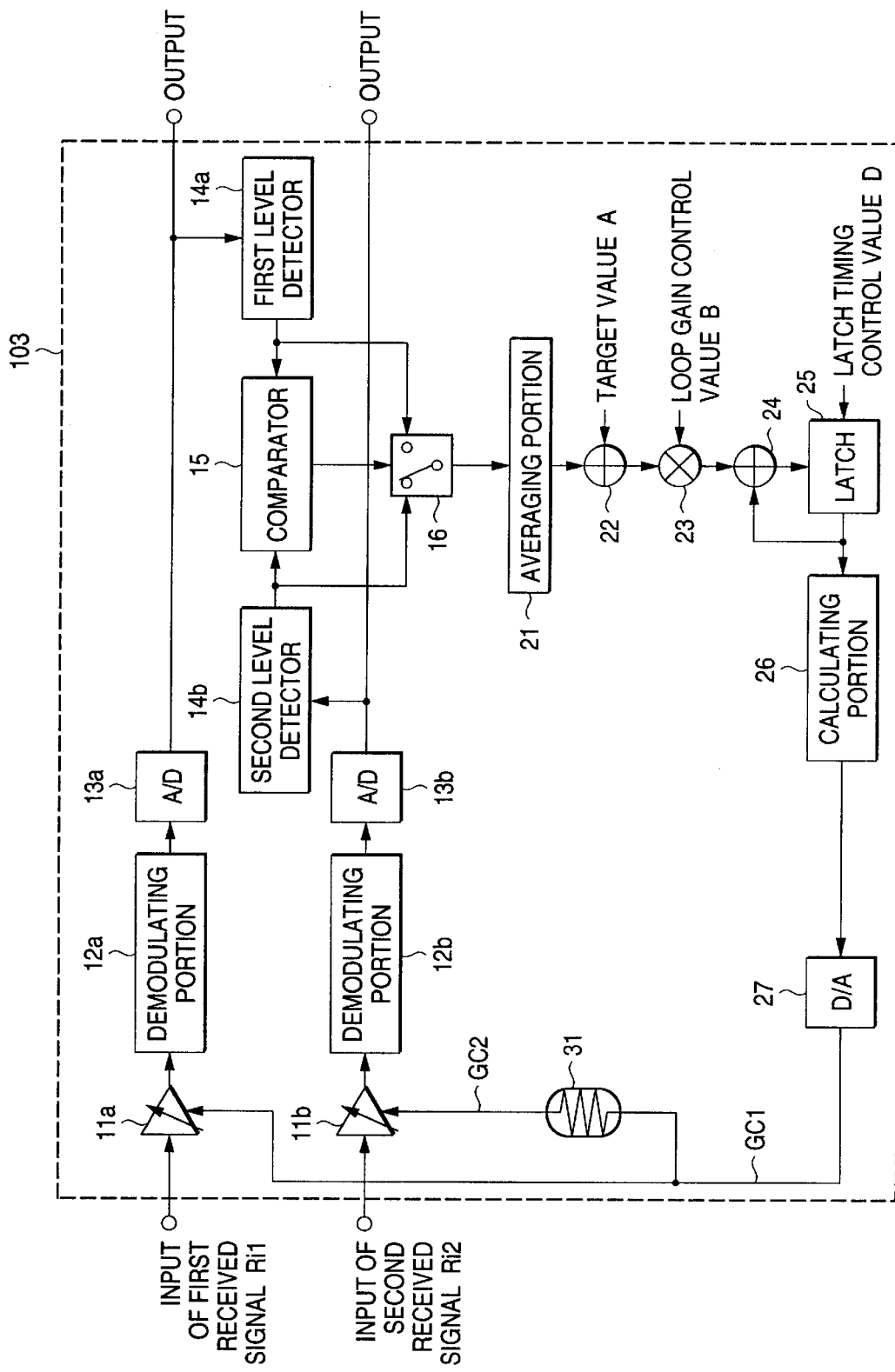
FIG. 5 is a diagram showing an automatic gain control circuit according to a third embodiment of the present invention.

FIG. 5 is a diagram showing the structure of an automatic gain control circuit according to a third embodiment of the present invention. The automatic gain control method according to the present invention is applied to the foregoing automatic gain control circuit. The same elements as those shown in FIG. 1 (the first embodiment) are given the same reference numerals and the same elements are omitted from illustration. Similarly to the first and second embodiments, the automatic gain control circuit according to this embodiment and incorporating a plurality of receiving systems has a receiving circuit including two receiving systems.

Referring to FIG. 5, the automatic gain control circuit according to this embodiment comprises the variable gain amplifiers 11a and 11b, the demodulating portions 12a and 12b, the A/D converters 13a and 13b, level detectors 14a and 14b, a comparator 15, a switch circuit 16, the averaging portion 21, the adder 22 for calculating difference in a converged value, the multiplier 23 for controlling a loop gain, the adder 24 of the integration circuit, the latch circuit 25 of the integration circuit, the calculating portion 26, the D/A converter 27 and the thermistor 31.

The first variable gain amplifier 11a, the first demodulating portion 12a and the first A/D converter 13a constitute the first receiving system to which the first received signal Ri1 is input and which outputs the first demodulated signal Rd1. The second variable gain amplifier 11b, the second demodulating portion 12b and the second A/D converter 13b constitute the second receiving system to which the second received signal Ri2 is input and which outputs the second demodulated signal Rd2. The level detectors 14a and 14b, the comparator 15, the switch circuit 16, the averaging portion 21, the adder 22 for calculating difference in a converged value, the multiplier 23 for controlling a loop gain, the adder 24 of the integration circuit, the latch circuit 25 of the integration circuit, the calculating portion 26, the D/A converter 27 and the thermistor 31 constitute the automatic gain control loop.

The amplifying operation and the demodulating operation in each of the receiving systems are performed similarly to those of the automatic gain control circuit according to the first embodiment. In the automatic gain control loop, the first level detector 14a detects the level of the first demodulated signal Rd1. Then, the second level detector 14b detects the level of the second demodulated signal Rd2. The comparator 15 compares the levels of the signals detected by the first level detector 14a and the second level detector 14b. In accordance with a result of the comparison, a result of the detection of the levels of the demodulated signals in the receiving system having a higher level is selected by the switch circuit 16.

The result of the detection of the level of the selected demodulated signal is subjected to the following sequential process similarly to the first embodiment: averaging of the signal level for a predetermined time which is performed by the averaging portion 21, the calculation of the difference from the target value A which is performed by the adder 22 for calculating difference in a converged value, the control of the loop gain which is performed by the multiplier 23 for controlling a loop gain, and the integration of data which is performed by the adder 24 of the integration circuit and the latch circuit 25 of the integration circuit.

The calculating portion 26 generates, from the integration data, data about the control voltage for the first variable gain amplifier 11a, data above being converted into an analog value by the D/A converter 27. The signal converted into the analog value is supplied to the first variable gain amplifier 11a of the first receiving system as the control signal GC1 having the potential determined by the automatic gain control loop. The thermistor 31 corrects the dispersion of the temperature characteristic between the first variable gain amplifier 11a and the second variable gain amplifier 11b to control the gain of the second variable gain amplifier 11b of the second receiving system with the potential of the corrected control signal GC2. The various parameters (A, B, D) may be the values calculated by the DSP or the like or the values obtained by making a reference to a reference table, such as a numeric-value conversion table written on a ROM or the like, similarly to the first embodiment.

The operation of the automatic gain control circuit according to this embodiment will now be described with reference to FIG. 5. In each receiving system, similarly to the first embodiment, the first received signal Ri1 and second received signal Ri2 are amplified, demodulated and converted into digital values. Thus, the first demodulated signal Rd1 and second demodulated signal Rd2 are output.

In the automatic gain control loop, the level of a portion of the first demodulated signal Rd1 of the first receiving system is detected by the first level detector 14a. The level of a portion of the second demodulated signal Rd2 of the second receiving system is detected by the second level detector 14b. The comparator 15 compares the levels of the signals detected by the first level detector 14a and the second level detector 14b. In accordance with a result of the comparison, a result of the detected level of the demodulated signal of the receiving system having a higher level is selected by the switch circuit 16.

The result of the detection of the level of the selected demodulated signal is, similarly to the first embodiment, sequentially subjected to the level detection which is performed by the level detector 14, the averaging process which is performed by the averaging portion 21, the process for calculating the difference from the target value A which is performed by the adder 22 for calculating difference in a converged value, the control of the loop gain by multiplying the loop-gain control value B which is performed by the multiplier 23 for controlling a loop gain, the integrating process which is performed by the adder 24 and the latch circuit 25 and the data conversion process which is performed by the calculating portion 26.

Data integrated by the integration circuit is, by the calculating portion 26, converted into data corresponding to the control voltage for the first variable gain amplifier 11a. A result of the calculation is converted into an analog value by the D/A converter 27 so as to be fed back as the control voltages for the variable gain amplifiers 11a and 11b based on data above. When feedback to the variable gain amplifiers 11a and 11b is performed, the output GC1 of the D/A converter 27 is, as it is, used for the first variable gain amplifier 11a. The GC2 through the thermistor 31 is used for the second variable gain amplifier 11b to correct the dispersion of the temperature characteristic between the first variable gain amplifier 11a and the second variable gain amplifier 11b.

Figure 6:
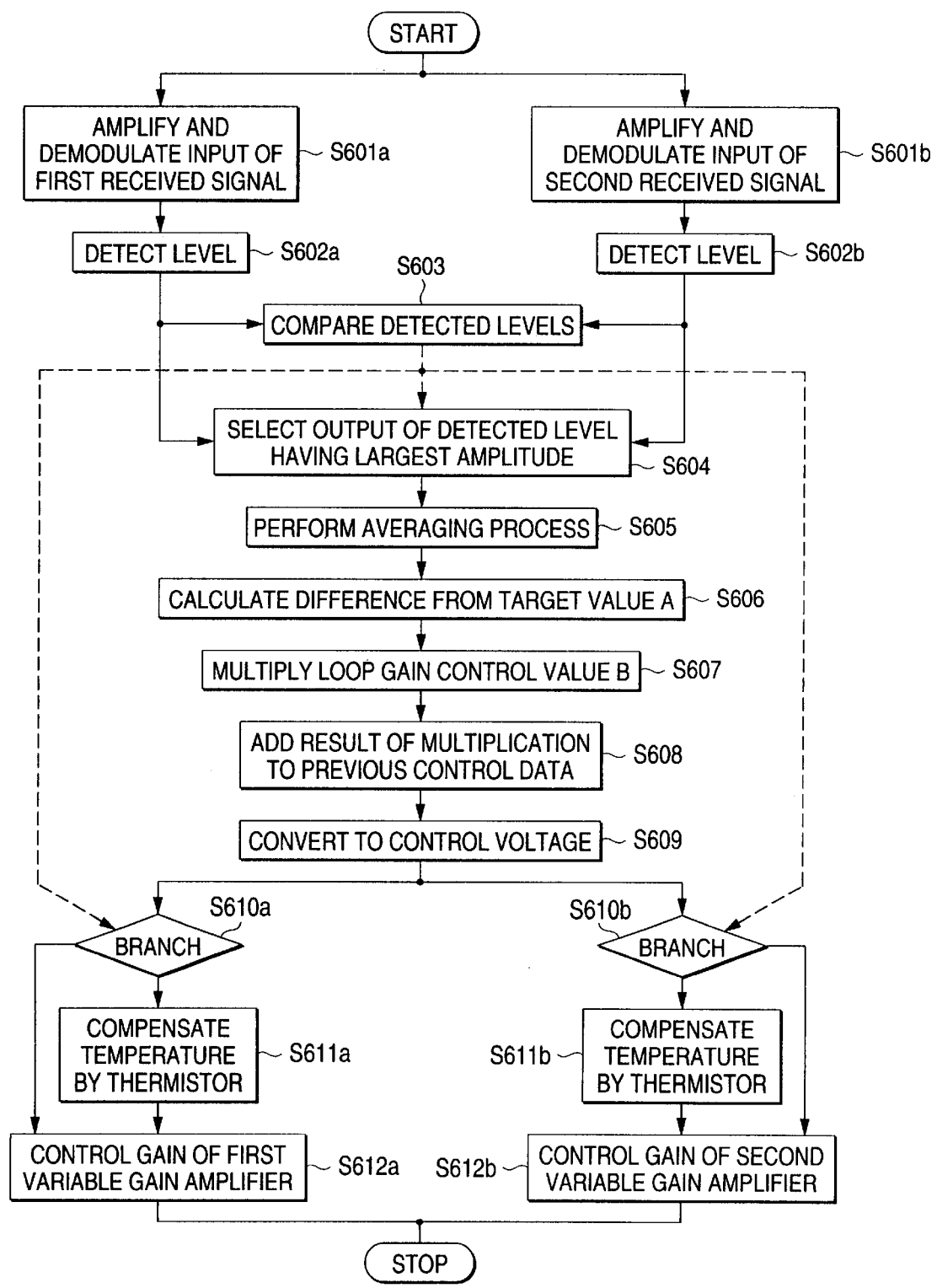
FIG. 6 is a flow chart of the procedure of a software program (a automatic gain control method) which is executed in a DSP according to the third embodiment.

When the digital signal processor (DSP) is employed in the automatic gain control loop of the automatic gain control circuit according to this embodiment, the level detectors 14a and 14b, the comparator 15, the switch circuit 16, the averaging portion 21, the adder 22 for calculating difference in a converged value, the multiplier 23 for controlling a loop gain, the adder 24 of the integration circuit, the latch circuit 25 of the integration circuit, the calculating portion 26 and the D/A converter 27 shown in FIG. 5 are realized by the DSP. The procedure of the software program (the automatic gain control method) which is executed in the DSP will now be described with reference to a flow chart shown in FIG. 6.

Similarly to steps S201a and S201b shown in FIG. 2 (the first embodiment), in steps S601a and S601b, the first and second first received signals Ri1 and Ri2 are amplified by the variable gain amplifiers 11a and 11b, demodulated by the demodulating portions 12a and 12b and converted into digital values by the A/D converters 13a and 13b. Thus, the first demodulated signal Rd1 and the second demodulated signal Rd2 are output.

In steps S602a and S602b, the level of a portion of each of the first demodulated signal Rd1 of the first receiving system and the second demodulated signal Rd2 of the second receiving system is detected. In step S603 the levels of the signals detected in steps S601a and S601b are compared. In step S604 a result of the detection of the level of the demodulated signal of a receiving system having the largest amplitude (higher signal level) is selected in accordance with a result of the comparison performed in step S603.

The averaging process in step S605, the calculation of the difference from the target value A in step S606, the control of the loop gain in step S607, the integration process in step S608 and the process for conversion to data corresponding to the control voltage in step S609 are performed similarly to steps S202 to S207 shown in FIG. 2 (the first embodiment).

If the output of the detected level of the first receiving system is selected in step S604, the operation is, in step S610a, branched to step S612a so that the output GC1 converted into data corresponding to the control voltage in step S609 is, as it is, used for the first receiving system to control the gain of the first variable gain amplifier 11a. As for the output for the second receiving system having the level detection output which has not been selected, the operation is, in step S610b, branched to step S611b so that the dispersion of the temperature characteristics between the first variable gain amplifier 11a and the second variable gain amplifier 11b is corrected by using the signal GC2 obtained by subjecting the data corresponding to the control voltage converted in step S609 to the compensation of the temperature by the thermistor 31. In step S612b the gain of the second variable gain amplifier 11b is controlled.

If the level detection output of the second receiving system is selected instep S604, branching in step S610a and 610b is performed to steps S611a and S612b, respectively.

As described above, the automatic gain control circuit according to this embodiment enables the automatic gain control circuit incorporating a plurality of receiving systems to make a portion of the automatic gain control loop to be common without the automatic gain control loops which have hitherto be required by the number corresponding to the number of the receiving Systems. The foregoing structure can be realized by unifying the receiving systems for use in the automatic gain control loop by always selecting a signal having a highest level in accordance with a result of the level detection and by subjecting feedback data for controlling the gain of the variable gain amplifiers to correction of the dispersion of the temperature characteristic of the variable gain amplifier of each receiving system by using the thermistor 31. Thus, the necessity of providing the automatic gain control loops by the number corresponding to the number of the receiving systems can be eliminated. Therefore, commonality of a portion of the automatic gain control loop is realized. The automatic gain control circuit incorporating the automatic gain control loop which is constituted by a circuit enables the number of the electronic circuit elements to be reduced. Thus, the size of the circuit can be reduced and enlargement of the mounting area of the circuit substrate and that of power consumption in the circuit can be prevented.

If a plurality of received signals having different levels are input owing to an influence of fading or multipath, a signal having the highest level is always selected by the comparator 15 and the switch circuit 16 so as to generate a gain control voltages for the variable gain amplifiers 11a and 11b. Therefore, a problem that an excessively large input is supplied to the A/D converter which is usually disposed in the rear of the variable gain amplifier of a signal system which is not selected by the switch circuit 16 and thus the A/D converter is saturated can be prevented.

Also in a case where the digital signal processor (DSP) is employed in the automatic gain control loop to automatically control the gains of a plurality of receiving systems by executing a software program, commonality of data, which must be used, can be realized. Thus, elongation of time required to complete the process and enlargement of power consumption can be prevented.

Although this embodiment has the structure that the automatic gain control circuit has first and second receiving systems, a similar effect can be obtained from an automatic gain control circuit having three or more receiving systems.

Fourth Embodiment

Figure 7:
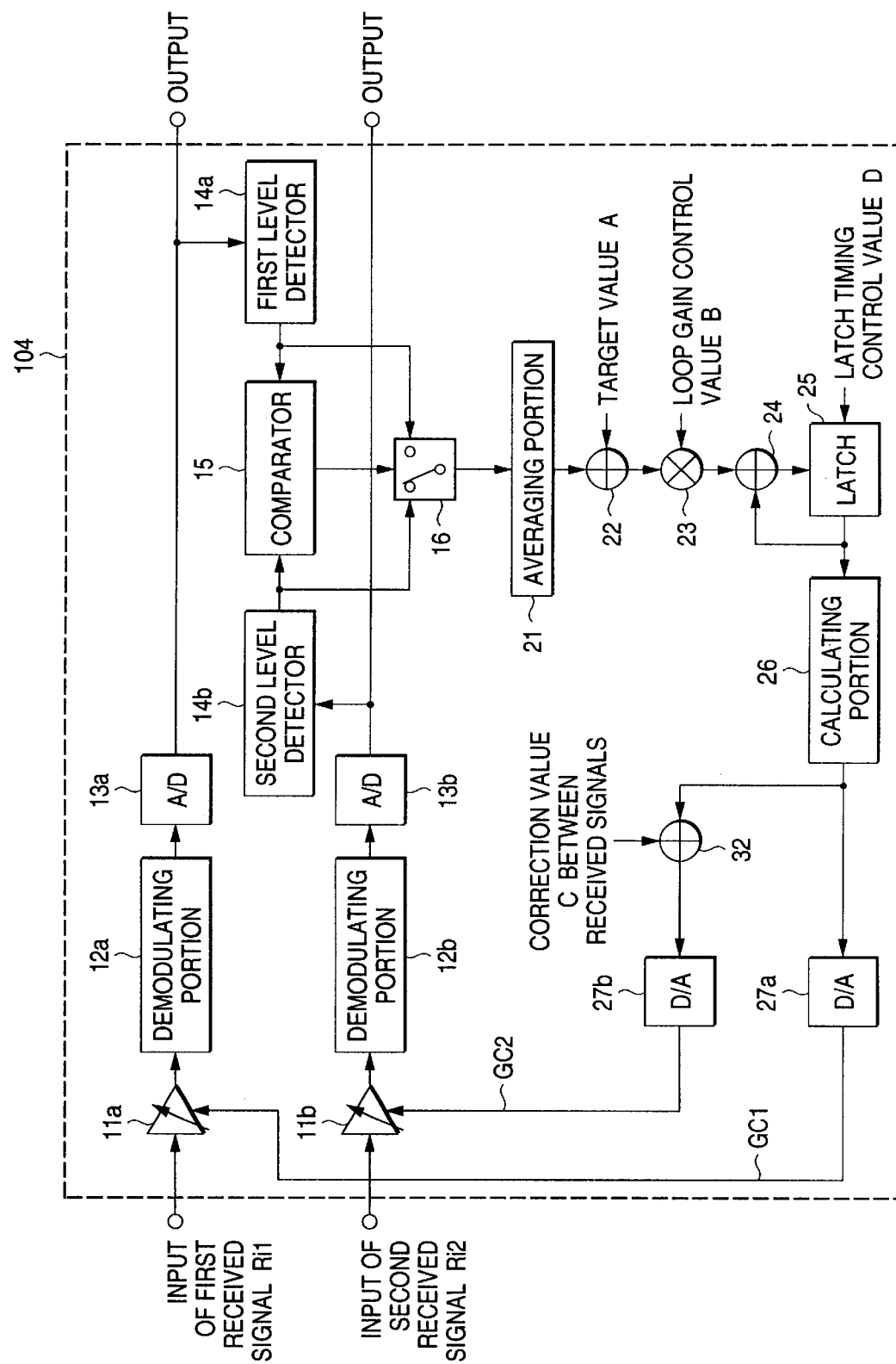
FIG. 7 is a diagram showing the structure of an automatic gain control circuit according to a fourth embodiment of the present invention.

FIG. 7 is a diagram showing the structure of an automatic gain control circuit according to a fourth embodiment of the present invention. The automatic gain control method according to the present invention is applied to the foregoing automatic gain control circuit. The same elements as those shown in FIGS. 1, 3 and 5 (the first, second and the third embodiments) are given the same reference numerals and the same elements are omitted from illustration. Similarly to the first, second and the third embodiments, the automatic gain control circuit according to this embodiment and incorporating a plurality of receiving systems has a receiving circuit including two receiving systems.

Referring to FIG. 7, the automatic gain control circuit according to this embodiment comprises the variable gain amplifiers 11a and 11b, the demodulating portions 12a and 12b, the A/D converters 13a and 13b, the level detectors 14a and 14b, the comparator 15, the switch circuit 16, the averaging portion 21, the adder 22 for calculating difference in a converged value, the multiplier 23 for controlling a loop gain, the adder 24 of the integration circuit, the latch circuit 25 of the integration circuit, the calculating portion 26, the adder 32 for correction and the D/A converters 27a and 27b.

The first variable gain amplifier 11a, the first demodulating portion 12a and the first A/D converter 13a constitute the first receiving system to which the first received signal Ri1 is input and which outputs the first demodulated signal Rd1. The second variable gain amplifier 11b, the second demodulating portion 12b and the second A/D converter 13b constitute the second receiving system to which the second received signal Ri2 is input and which outputs the second demodulated signal Rd2. The level detectors 14a and 14b, the comparator 15, the switch circuit 16, the averaging portion 21, the adder 22 for calculating difference in a converged value, the multiplier 23 for controlling a loop gain, the adder 24 of the integration circuit, the latch circuit 25 of the integration circuit, the calculating portion 26, the adder 32 for correction and the D/A converters 27a and 27b constitute the automatic gain control loop.

The amplifying operation and the demodulating operation in each of the receiving systems are performed similarly to those of the automatic gain control circuit according to the first embodiment. In the automatic gain control loop, similarly to the automatic gain control circuit according to the third embodiment, the first level detector 14a detects the level of the first demodulated signal Rd1. Then, the second level detector 14b detects the level of the second demodulated signal Rd2. The comparator 15 compares the levels of the signals detected by the first level detector 14a and the second level detector 14b. In accordance with a result of the comparison, a result of the detection of the levels of the demodulated signals in the receiving system having a higher level is selected by the switch circuit 16.

The result of the detection of the level of the selected demodulated signal is subjected to the following sequential process similarly to the first embodiment: averaging of the signal level for a predetermined time which is performed by the averaging portion 21, the calculation of the difference from the target value A which is performed by the adder 22 for calculating difference in a converged value, the control of the loop gain which is performed by the multiplier 23 for controlling a loop gain, and the integration of data which is performed by the adder 24 of the integration circuit and the latch circuit 25 of the integration circuit.

The calculating portion 26 generates, from the integration data, data about the control voltage for the first variable gain amplifier 11a, data above being converted into an analog value by the D/A converter 27a. The signal converted into the analog value is supplied to the first variable gain amplifier 11a of the first receiving system as the control signal GC1 having the potential determined by the automatic gain control loop. The GC2 which is supplied to the second variable gain amplifier 11b of the second receiving system is subjected to the correction of the temperature characteristics and the frequency characteristics between the variable gain amplifiers 11a and 11b by adding the correction value C between the received signals to the data about the control voltage generated in the calculating portion 26. Then, a signal is obtained by conversion to an analog value by the D/A converter 27b so as to be used as described above. Then, the gain of the second variable gain amplifier 11b is controlled with the potential of the control signal GC2.

The various parameters (A, B, D) may be the values calculated by the DSP or the like or the values obtained by making a reference to a reference table, such as a numeric-value conversion table written on a ROM or the like, similarly to the first and second embodiment.

The operation of the automatic gain control circuit according to this embodiment will now be described with reference to FIG. 7. In each receiving system, similarly to the first embodiment, the first received signal Ri1 and second received signal Ri2 are amplified, demodulated and converted into digital values. Thus, the first demodulated signal Rd1 and second demodulated signal Rd2 are output.

In the automatic gain control loop, the level of a portion of the first demodulated signal Rd1 of the first receiving system is detected by the first level detector 14a similarly to the third embodiment. The level of a portion of the second demodulated signal Rd2 of the second receiving system is detected by the second level detector 14b. The comparator 15 compares the levels of the signals detected by the first level detector 14a and the second level detector 14b. In accordance with a result of the comparison, a result of the detected level of the demodulated signal of the receiving system having a higher level is selected by the switch circuit 16.

The result of the detection of the level of the selected demodulated signal is, similarly to the first embodiment, sequentially subjected to the level detection which is performed by the level detector 14, the averaging process which is performed by the averaging portion 21, the process for calculating the difference from the target value A which is performed by the adder 22 for calculating difference in a converged value, the control of the loop gain by multiplying the loop-gain control value B which is performed by the multiplier 23 for controlling a loop gain, the integrating process which is performed by the adder 24 and the latch circuit 25 and the data conversion process which is performed by the calculating portion 26.

The signal converted into data corresponding to the control voltage for the first variable gain amplifier hla by the calculating portion 26 is converted into an analog value by the D/A converter 27a so as to be fed back as the control voltages for the variable gain amplifiers 11a and 11b and based on data above. When feedback to the variable gain amplifiers 11a and 11b is performed, the output GC1 of the D/A converter 27a is, as it is used, for the first variable gain amplifier 11a of the first receiving system. The control signal GC2 obtained by adding the correction value C between the received signals in the adder 32 for correction and converted into an analog value by the D/A converter 27b is used for the second variable gain amplifier 11b of the second receiving system in order to correct the dispersion of the temperature characteristics and that of the frequency characteristics between the first variable gain amplifier 11a and the second variable gain amplifier 11b.

Figure 8:
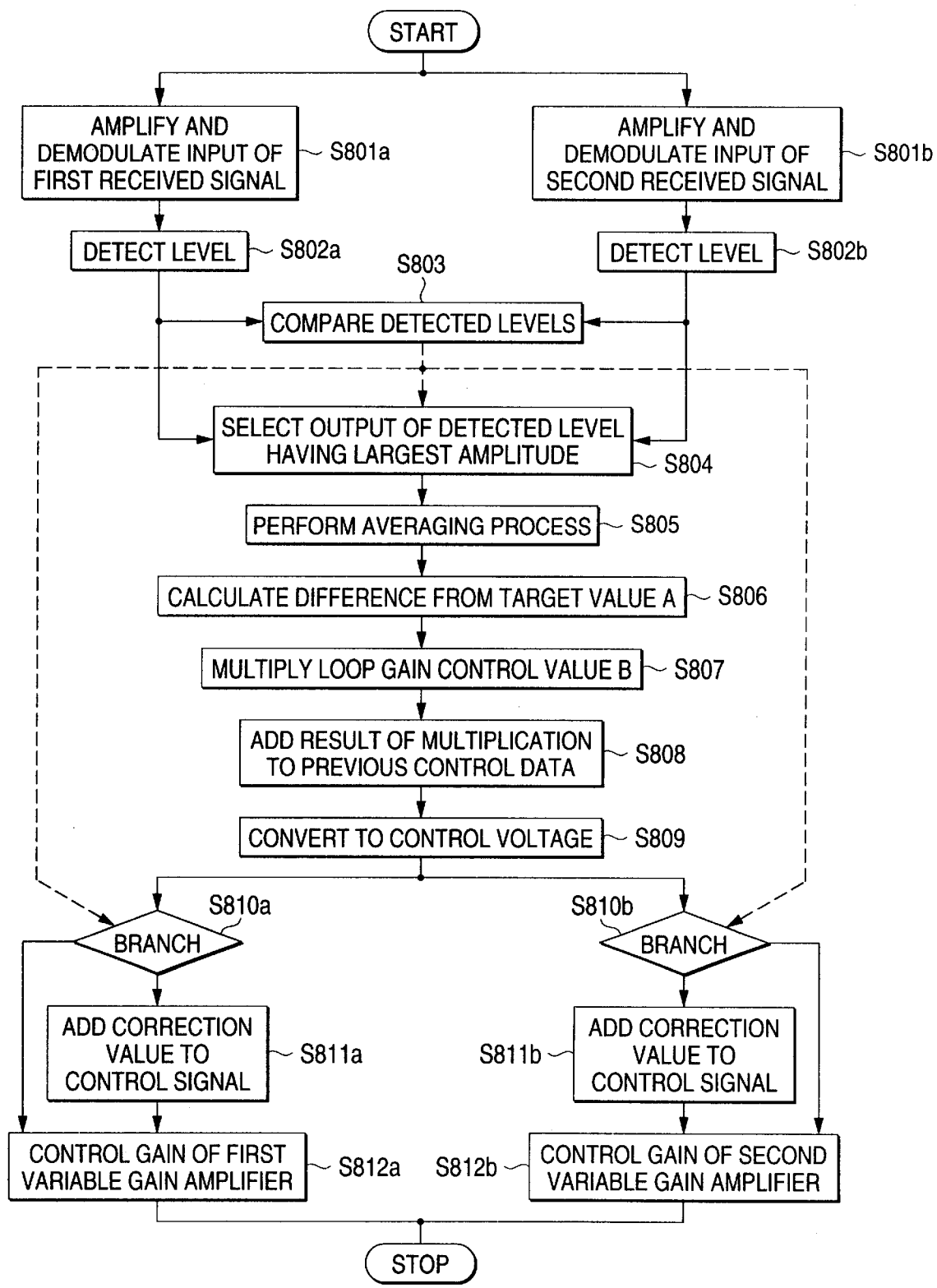
FIG. 8 is a flow chart of the procedure of a software program (a automatic gain control method) which is executed in a DSP according to the fourth embodiment.

When the digital signal processor (DSP) is employed in the automatic gain control loop of the automatic gain control circuit according to this embodiment, the level detectors 14a and 14b, the comparator 15, the switch circuit 16, the averaging portion 21, the adder 22 for calculating difference in a converged value, the multiplier 23 for controlling a loop gain, the adder 24 of the integration circuit, the latch circuit 25 of the integration circuit, the calculating portion 26, the adder 32 for correction and the D/A converters 27a and 27b are realized by the DSP. The procedure of the software program (the automatic gain control method) which is executed in the DSP will now be described with reference to a flow chart shown in FIG. 8.

Similarly to steps S201a and S201b shown in FIG. 2 (the first embodiment), in steps S801a and S801b, the first and second first received signals Ri1 and Ri2 are amplified by the variable gain amplifiers 11a and 11b, demodulated by the demodulating portions 12a and 12b and converted into digital values by the A/D converters 13a and 13b. Thus, the first demodulated signal Rd1 and the second demodulated signal Rd2 are output.

In steps S802a and S802b, the level of a portion of each of the first demodulated signal Rd1 of the first receiving system and the second demodulated signal Rd2 of the second receiving system is detected. In step S803 the levels of the signals detected in steps S801a and S801b are compared. In step S804 a result of the detection of the level of the demodulated signal of a receiving system having the largest amplitude (higher signal level) is selected in accordance with a result of the comparison performed in step S803.

The averaging process in step S805, the calculation of the difference from the target value A in step S806, the control of the loop gain in step S807, the integration process in step S808 and the process for conversion to data corresponding to the control voltage in step S809 are performed similarly to steps S202 to S207 shown in FIG. 2 (the first embodiment).

If the output of the detected level of the first receiving system is selected in step S804, the operation is, in step S810a, branched to step S812a so that the output GC1 converted into data corresponding to the control voltage in step S809 is, as it is, used for the first receiving system to control the gain of the first variable gain amplifier 11a. As for the output for the second receiving system having the level detection output which has not been selected, the operation is, in step S810b, branched to step S811b so that the dispersion of the temperature characteristics and the frequency characteristics between the first variable gain amplifier 11a and the second variable gain amplifier 11b is corrected by using the signal GC2 obtained by adding the correction value C between the received signals to data corresponding to the control voltage and converted in step S809. In step S812b the gain of the second variable gain amplifier 11b is controlled.

The correction value C between the received signals is similar to that for use in the above-mentioned automatic gain control circuit. If the level detection output of the second receiving system is selected in step S804, branching in step S810a and 810b is performed to steps S811a and S812b, respectively.

As described above, the automatic gain control circuit according to this embodiment enables the automatic gain control circuit incorporating a plurality of receiving systems to make a portion of the automatic gain control loop to be common without the automatic gain control loops which have hitherto be required by the number corresponding to the number of the receiving systems. The foregoing structure can be realized by unifying the receiving systems for use in the automatic gain control loop by always selecting a signal having a highest level in accordance with a result of the level detection and by subjecting feedback data for controlling the gain of the variable gain amplifiers to correction of the dispersion of the temperature characteristics and the frequency characteristics of the variable gain amplifier of each receiving system by performing the addition of the correction value C by the adder 32. Therefore, the necessity of providing the automatic gain control loops by the number corresponding to the number of the receiving systems can be eliminated. Thus, commonality of a portion of the automatic gain control loop can be realized. Thus, the automatic gain control circuit incorporating the automatic gain control loop which is constituted by a circuit enables the number of the electronic circuit elements to be reduced. Thus, the size of the circuit can be reduced and enlargement of the mounting area of the circuit substrate and that of power consumption in the circuit can be prevented.

If a plurality of received signals having different levels are input owing to an influence of fading or multipath, a signal having the highest level is always selected by the comparator 15 and the switch circuit 16 so as to generate a gain control voltages for the variable gain amplifiers 11a and 11b. Therefore, a problem that an excessively large input is supplied to the A/D converter which is usually disposed in the rear of the variable gain amplifier of a signal system which is not selected by the switch circuit 16 and thus the A/D converter is saturated can be prevented.

Also in a case where the digital signal processor (DSP) is employed in the automatic gain control loop to automatically control the gains of a plurality of receiving systems by executing a software program, commonality of data, which must be used, can be realized. Thus, elongation of time required to complete the process and enlargement of power consumption can be prevented.

Although this embodiment has the structure that the automatic gain control circuit has first and second receiving systems, a similar effect can be obtained from an automatic gain control circuit having three or more receiving systems.

Fifth Embodiment

Figure 9:
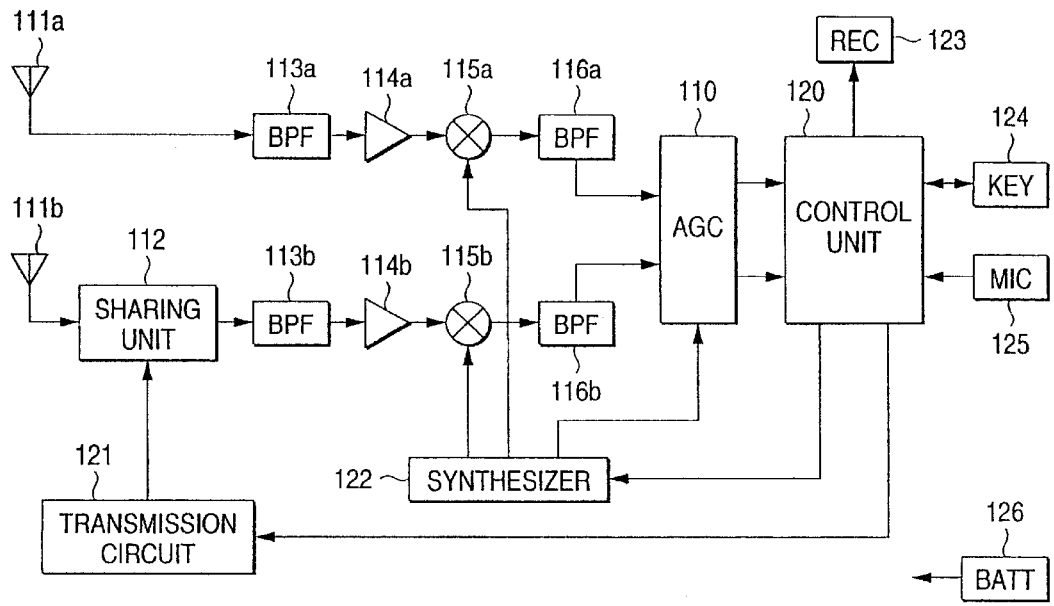
FIG. 9 is a diagram showing the structure of a receiving apparatus according to a fifth embodiment of the present invention.

FIG. 9 is a diagram showing a receiving apparatus according to a fifth embodiment of the present invention. The receiving apparatus according to this embodiment comprises an automatic gain control circuit (AGC) which is the automatic gain control circuit according to any one of the first to fourth embodiments. In this embodiment, the receiving apparatus has two receiving systems similarly to the first, second, third and the fourth embodiments.

Referring to FIG. 9, the receiving apparatus according to this embodiment comprises antennas 111a and 111b for performing transmission and receipt, an antenna sharing unit 112, high-frequency band-pass filters 113a and 113b, low-noise amplifiers 114a and 114b, down-mixers 115a and 115b for converting the frequency from a high frequency region to an intermediate frequency region, intermediate-frequency band-pass filters 116a and 116b, an automatic gain control circuit (AGC) 110, a transmission circuit 121, a frequency synthesizer 122, a receiver 123, a key input portion 124 for operating the receiving apparatus, a microphone 125, an electric power source 126 and a control unit 120 for controlling the receiving apparatus.

The operation of the receiving apparatus according to this embodiment will now be described with reference to FIG. 9. The first antenna 111a and the second antenna 111b receive a signal (for example, a 2 [GHz] signal is assumed). Signal components except for a required frequency range of the signal input through the 111a are attenuated by the high-frequency band-pass filter 113a. The signal input through the second antenna 111b is allowed to pass through the sharing unit 112, and then the signal components except for a required frequency range are attenuated by the high-frequency band-pass filter 113b.

The signals allowed to pass through the band-pass filters 113a and 113b are amplified by the low-noise amplifiers 114a and 114, and then the frequencies of the signals are converted into the intermediate frequency range by the down-mixers 115a and 115b (for example, 570 [MHz]). Then, the signals are input to the automatic gain control circuit 110 through the intermediate-frequency band-pass filters 116a and 116b.

The signals input to the automatic gain control circuit 110 is demodulated by the demodulating portions 11a and 11b disposed in the automatic gain control circuit 110 so that the signals are output to the control unit 120 as base band signals. Thus, the signals are processed. In an automatic gain control loop in the automatic gain control circuit 110, the levels of the received signals are detected by the level detectors 14 (14a and 14b). Then, the signal processes according to the first, second, third and the fourth embodiments are performed so that feedback voltages (the control signals GC1 and GC2) which must be supplied to the variable gain amplifiers 11a and 11b are generated.

As described above, the receiving apparatus according to this embodiment comprises the automatic gain control circuit 110 according to any one of the first, second, third and fourth embodiments. Therefore, if a plurality of receiving systems are provided, the receiving systems for use in the automatic gain control loop are uniformed into one system. Also feedback data for controlling the gain of each variable gain amplifier is subjected to correction of dispersion of the temperature characteristic or the frequency characteristic between the variable gain amplifiers of the receiving systems. Therefore, the commonality of a portion of the automatic gain control loop is permitted. As a result, the number of the electronic circuit elements can be reduced, causing the size of the circuit to be reduced. Moreover, enlargement of the mounting area of the circuit substrate and that of power consumption in the circuit can be prevented. When the digital signal processor (DSP) is employed in the automatic gain control loop of the automatic gain control circuit 110 to automatically control the gains of a plurality of receiving systems by using a software program, commonality of data, which must be used, is permitted. Thus, elongation of time required to complete the process and enlargement of power consumption can be prevented.

When the automatic gain control circuit 110 according to the third embodiment or the fourth embodiment, a signal having the highest level is always selected so as to generate gain control signals for the variable gain amplifiers 11a and 11b if aplurality of received signals having different levels are input owing to an influence of fading or multipath. Therefore, a problem that an excessively large input is supplied to the A/D converter which is usually disposed in the rear of the variable gain amplifier of a signal system which is not selected by the switching circuit 16 and thus the A/D converter is saturated can be prevented.

Although this embodiment has the structure that the automatic gain control circuit has first and second receiving systems, a similar effect can be obtained from an automatic gain control circuit having three or more receiving systems.

As described above, the automatic gain control circuit, the receiving apparatus comprise the circuit, the automatic gain control method for the receiving apparatus and the recording medium according to the present invention comprise the control-signal generating means (the control-signal generating step) for detecting the level of one of n received signals to generate a feedback signal so as to employ the feedback signal as a control signal for one of the n variable gain amplifiers; and the first correction means (the first correction step) for subjecting the control signal for the one variable gain amplifier generated by the control-signal generating means (the control-signal generating step to correction of dispersion of temperature characteristics of the other variable gain amplifiers so as to employ the corrected signals as control signals for the other variable gain amplifiers. Therefore, partial commonality of the circuit of the automatic gain control loop is permitted. As a result, the size of the circuit can be reduced. Thus, enlargement of the mounting area of the circuit substrate and that of power consumption in the circuit can be prevented. Moreover, commonality of data, which must be used, is permitted for the automatic gain control method for the receiving apparatus which automatically controls the gains of n receiving systems and the recording medium using the software program. Thus, elongation of time required to complete the process and enlargement of power consumption can be prevented.

The automatic gain control circuit, the receiving apparatus comprise the circuit, the automatic gain control method for the receiving apparatus and the recording medium according to the present invention comprise the control-signal generating means (the control-signal generating step) for detecting the level of one of n received signals to generate a feedback signal so as to employ the feedback signal as a control signal for one of the n variable gain amplifiers; and the second correction means (the second correction step), for example, the adding means for adding the correction values subjecting the control signal for the one variable gain amplifier generated by the control-signal generating means (the control-signal generating step) to correction of dispersion of the temperature characteristics and the frequency characteristics of the other variable gain amplifiers so as to employ the corrected signals as control signals for the other variable gain amplifiers. Therefore, partial commonality of the circuit of the automatic gain control loop is permitted. As a result, the size of the circuit can be reduced. Thus, enlargement of the mounting area of the circuit substrate and that of power consumption in the circuit can be prevented. Moreover, commonality of data, which must be used, is permitted for the automatic gain control method for the receiving apparatus which automatically controls the gains of n receiving systems and the recording medium using the software program. Thus, elongation of time required to complete the process and enlargement of power consumption can be prevented.

The automatic gain control circuit, the receiving apparatus comprise the circuit, the automatic gain control method for the receiving apparatus and the recording medium according to the present invention comprise the control-signal generating means (the control-signal generating step) which has n level detection means (the level detection steps) to detect levels of n received signals; and the comparison means (the comparison step) compares the detected levels of the n received signals; the selection means (the selection step) selects the output of a level detection means having a highest level which has been detected in accordance with a result of the comparison performed by the comparison means (the comparison step). Therefore, if a plurality of received signals having different levels are input owing to an influence of fading or multipath, a signal having the highest level is always selected so as to generate gain control signals for the variable gain amplifiers. Therefore, a problem that an excessively large input is supplied to the A/D converter which is usually disposed in the rear of the variable gain amplifier of a signal system which is not selected by the switching circuit 16 and thus the A/D converter is saturated can be prevented.

What is claimed is:

1. An automatic gain control circuit incorporating n variable gain amplifiers for controlling the amplitudes of n (n is a positive integer not smaller than two) received signals in response to control signals, said automatic gain control circuit comprising:

control-signal generating means for detecting the level of one of n received signals to generate a feedback signal so as to employ the feedback signal as a control signal for one of the n variable gain amplifiers; and first correction means for subjecting the control signal for the one variable gain amplifier generated by said control-signal generating means to correction of dispersion of temperature characteristics of the other variable gain amplifiers so as to employ the corrected signals as control signals for the other variable gain amplifiers.

2. An automatic gain control circuit according to claim 1, wherein said first correction means includes a thermistor for performing temperature compensation.

3. An automatic gain control circuit according to claim 1, wherein said control-signal generating means comprises:

n level detection means for detecting the levels of n received signals;

comparison means for comparing the detected levels of the n received signals; and selection means for selecting an output of a level detection means having a highest detected level in accordance with a result of a comparison made by said comparison means.

4. An automatic gain control circuit incorporating n variable gain amplifiers each of which controls the amplitudes of n (n is a positive integer not smaller than two) received signals in response to a control signal, said automatic gain control circuit comprising:

control-signal generating means for detecting the level of one of n received signals to generate a feedback signal so as to employ the feedback signal as a control signal for one of n variable gain amplifiers; and correction means for subjecting the control signal for the one variable gain amplifier generated by said control-signal generating means to correction of dispersion of temperature characteristics and frequency characteristics of the other variable gain amplifiers so as to employ the corrected signals as control signals for the other variable gain amplifiers.

5. An automatic gain control circuit according to claim 4 wherein said correction means is adding means for adding a predetermined correction value to the control signal of the one variable gain amplifier.

6. An automatic gain control circuit according to claim 4, wherein said control-signal generating means comprises:

n level detection means for detecting the levels of n received signals;

comparison means for comparing the detected levels of the n received signals; and selection means for selecting an output of a level detection means having a highest detected level in accordance with a result of a comparison made by said comparison means.

7. A receiving apparatus comprising an automatic gain control circuit claimed in any one of claims 1 to 4.

8. An automatic gain control method for a receiving apparatus incorporating n variable gain amplifiers for controlling the amplitudes of n (n is a positive integer not smaller than two) received signals in response to control signals, said automatic gain control method for a receiving apparatus comprising:

a control-signal generating step for detecting the level of one of n received signals to generate a feedback signal so as to employ the feedback signal as a control signal for one of the n variable gain amplifiers; and a first correction step for subjecting the control signal for the one variable gain amplifier generated in said control-signal generating step to correction of dispersion of temperature characteristics of the other variable gain amplifiers so as to employ the corrected signals as control signals for the other variable gain amplifiers.

9. An automatic gain control method according to claim 8, wherein said control-signal generating step comprises:

n level detection steps for detecting the levels of n received signals;

a comparison step for comparing the detected levels of the n received signals; and a selection step for selecting an output of a level detection step having a highest detected level in accordance with a result of a comparison made in said comparison means.

10. An automatic gain control method for a receiving apparatus incorporating n variable gain amplifiers each of which controls the amplitudes of n (n is a positive integer not smaller than two) received signals in response to control signals, said automatic gain control method for a receiving apparatus comprising:

a control-signal generating means for detecting the level of one of n received signals to generate a feedback signal so as to employ the feedback signal as a control signal for one of the n variable gain amplifiers; and a correction step for subjecting the control signal for the one variable gain amplifier generated in said control-signal generating step to correction of dispersion of temperature characteristics and frequency characteristics of the other variable gain amplifiers so as to employ the corrected signals as control signals for the other variable gain amplifiers.

11. An automatic gain control method according to claim 10, wherein said control-signal generating step comprises:

n level detection steps for detecting the levels of n received signals;

a comparison step for comparing the detected levels of the n received signals; and a selection step for selecting an output of a level detection step having a highest detected level in accordance with a result of a comparison made in said comparison means.

12. A recording medium which can be read by a computer, which stores a program which causes a computer to execute the automatic gain control method as claimed in any one of claims 8 to 11.

* * * * *